| United States Patent [19] | [11] Patent Number: 4,793,405 |
|---|---|
| Diggelmann et al. | [45] Date of Patent: Dec. 27, 1988 |

[54] PROCESS AND APPARATUS FOR DISSIPATING THE HEAT LOSS OF AT LEAST ONE ASSEMBLY OF ELECTRICAL ELEMENTS

[75] Inventors: Hans Diggelmann, Neuenegg; Bohdan Ulrich, Kehrsatz, both of Switzerland

[73] Assignee: Hasler AG., Bern, Switzerland

[21] Appl. No.: 941,150

[22] Filed: Dec. 12, 1986

[30] Foreign Application Priority Data

Dec. 13, 1985 [CH] Switzerland .................. 5329/85
Jun. 20, 1986 [CH] Switzerland .................. 2496/86

[51] Int. Cl.$^4$ .................. F28D 15/02; H01L 23/46
[52] U.S. Cl. .................. 165/104.33; 165/80.4; 165/104.14; 361/385; 62/519
[58] Field of Search .................. 165/104.33, 104.14, 165/104.21, 80.4; 361/385; 62/119, 333, 524, 519

[56] References Cited

U.S. PATENT DOCUMENTS

| 1,942,458 | 1/1934 | Taylor et al. | 62/333 |
| 3,165,150 | 1/1965 | Hurst et al. | 62/519 |
| 3,226,602 | 12/1965 | Elfving | 361/385 |
| 3,609,991 | 10/1971 | Chu et al. | 62/333 |
| 3,817,321 | 6/1974 | Cube et al. | 165/104.33 |

FOREIGN PATENT DOCUMENTS

| 1284506 | 12/1968 | Fed. Rep. of Germany | 361/385 |
| 2543075 | 7/1976 | Fed. Rep. of Germany | 361/385 |
| 429565 | 10/1974 | U.S.S.R. | 165/104.33 |

Primary Examiner—Albert W. Davis, Jr.
Attorney, Agent, or Firm—Brady, O'Boyle & Gates

[57] ABSTRACT

A condenser (28) is connected at the top (31) to a riser (22) and at the bottom (32) to a downpipe (23). Below the condenser (28), a vertically disposed, plate-shaped element (13) is arranged, there being formed along the two vertical edges of this element the conduits (22, 23) and, between these, several evaporators (15), separated from one another by perforations (17), for transferring the heat loss of the electrical elements to a liquid. Each of the evaporators (15) is connected at one end at the top (18) with the riser (22) and at the opposite end (19) at the bottom with the downpipe (23). The condenser (28), the conduits (22, 23), and the evaporators (15) constitute a unit sealed in a pressure-proof fashion which is filled with the liquid, that can be evaporated in the evaporators (15) by the heat loss and can be condensed in the condenser (28), to such an extent that the liquid volume lies above the uppermost evaporator (15) and below the condenser (28) or in the lower portion of the latter. The element (13) forms the rear wall of an electronic equipment rack (14), each evaporator (15) being in heat-conductive connection with the electrical elements arranged in a tier of the rack.

23 Claims, 5 Drawing Sheets

PROCESS AND APPARATUS FOR DISSIPATING THE HEAT LOSS OF AT LEAST ONE ASSEMBLY OF ELECTRICAL ELEMENTS

The invention relates to a process for dissipating the heat less of at least one assembly of electrical elements, and to an apparatus for performing the process.

SUMMARY OF THE INVENTION

It is an object of the invention to provide a process and apparatus usable in a simple and economical way universally for dissipation of heat loss of a great variety of different assemblies of electrical elements with differing power dissipation, especially for assemblies arranged superimposed in tiers, and making it possible to reliably remove even high quantities of heat loss from a plurality of assemblies.

The advantages of the invention are to be seen, in particular, in the following:

An almost constant temperature, namely the boiling temperature of the liquid under the prevailing operating pressure, occurs on the wall of each evaporator to be placed in heat-conductive communication with the assembly or assemblies of electrical elements; this temperature is independent of the power dissipation and independent of the thermal load on the remaining evaporators.

An extremely reliable cooling cycle is obtained, initiated and maintained solely by heat loss and gravity without the need for any movable parts (compressor, pump, or the like), in that the liquid vaporized in the evaporators rises as vapor bubbles in the liquid through the first conduit (in case of vigorous boiling, liquid can likewise be entrained), and the liquid condensed in the condenser descends in the second conduit due to gravity.

Owing to the fact that all evaporators are connected mutually in parallel with the condenser, the respectively required amount of condensed liquid is recycled into the evaporators by the cooling cycle in dependence on their thermal load and thus in dependence on the quantity of vaporized liquid; consequently, there will always be an adequate amount of liquid for vaporization and thus for maintaining the temperature constant in all evaporators.

BRIEF DESCRIPTION OF THE DRAWINGS

A conventional cooling device and embodiments of the invention will be described in greater detail below with reference to the drawings wherein.

DESCRIPTION OF THE PREFERRED EMBODIMENTS

Figure 1:
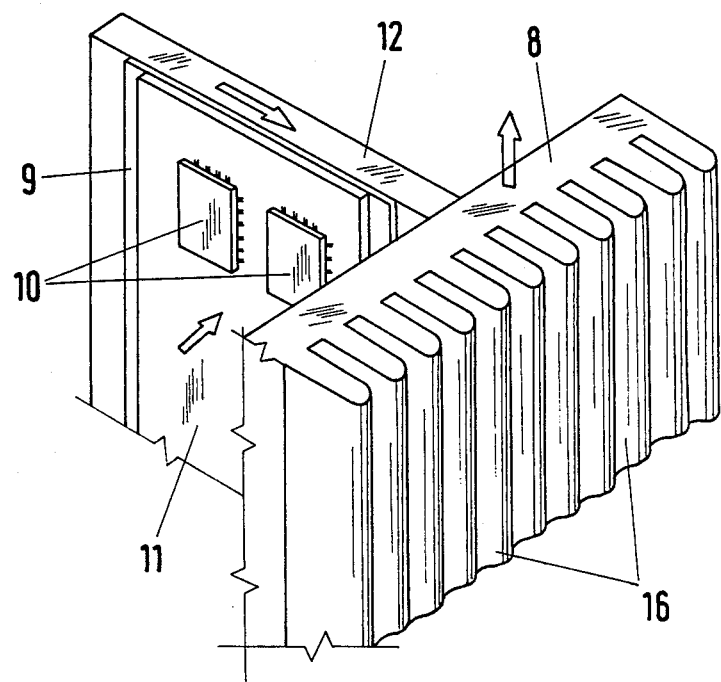
FIG. 1 is a perspective view of part of an electronic equipment with a conventional cooling device.

The device illustrated in FIG. 1 is an electronic appliance by applicant firm presently on the market. The electronic components 10 are arranged on substrates 11 (especially of aluminum oxide), and the latter are located on a supporting plate 9, for example of aluminum. The substrates 11 show relatively good heat conductivity and are in intimate thermal contact, via the supporting plates 9, with respectively one thermally conductive plate 12, likewise preferably made of aluminum. The thermally conductive plates 12 thus absorb the heat loss of components 10 and pass this heat loss on, by thermal conductivity, to a heat sink 8, the plates being connected to the latter in upright position, at a right angle, and in a thermally conductive fashion. For reasons of clarity, FIG. 1 shows in each case only one of the substrates 11, supports 9, and thermally conductive plates 12. The heat sink 8 consists of a relatively thick metallic panel, for example of aluminum, which distributes the thus-absorbed heat and passes it on to the surrounding air by way of cooling fins 16. These cooling fins serve as heat exchangers and transfer the heat to the air flowing past. The heat flow from the electronic components 10 via the substrates 11 to the cooling air is indicated by arrows.

Figure 2A:
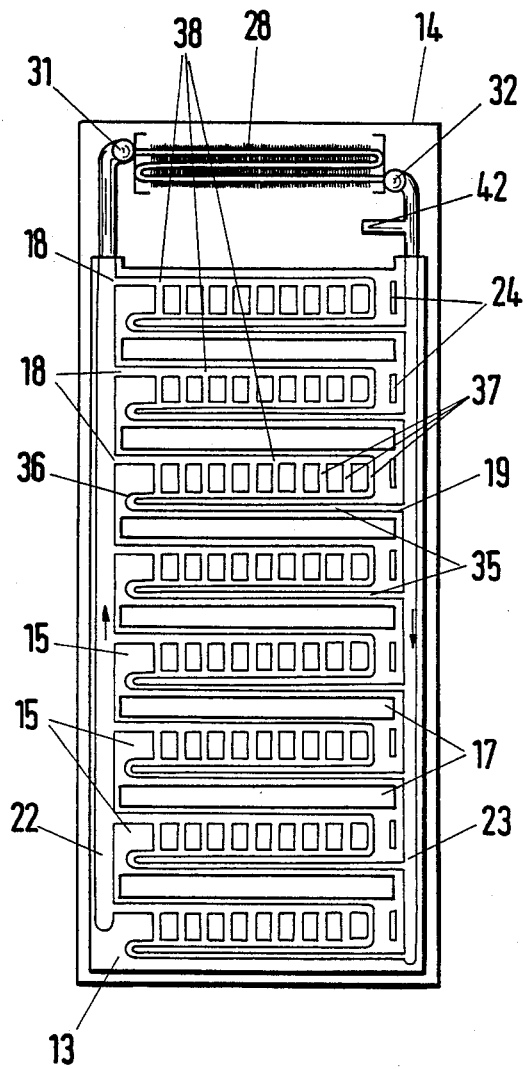
FIG. 2a shows a front view of a device according to this invention constituting the rear wall of an electronic equipment rack subdivided into tiers.
Figure 2B:
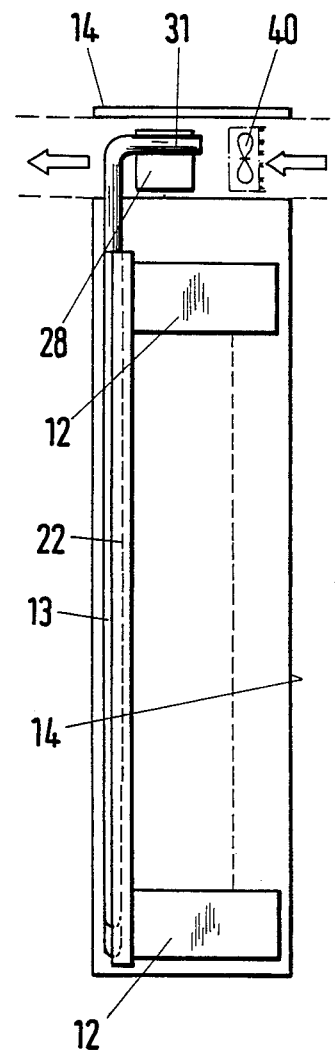
FIG. 2b is a lateral view of the device according to FIG. 2a with the electronic equipment rack.

The embodiment of the apparatus of this invention shown in FIG. 2 comprises a plate-like element 13 forming the rear wall of an electronic equipment rack 14. The rack 14 exhibits eight tiers; substrates 11 which can be mounted on larger, heat-conductive plates, can be inserted from the front in these tiers. Thermally conductive plates 12 corresponding to those of FIG. 1 can be seen in FIG. 2b, which are arranged in parallel to the inserted substrates 11 and optionally their support plates 9 and absorb the heat thereof.

The heat-conductive plates 12 are in good heat contact with evaporators 15 of the element 13, of which respectively one is associated with a tier of the rack 14. The evaporators 15 are separated by perforations 17 constituting thermal resistors. Electrical cables, for example, can be passed through these perforations, or plugs can be arranged for the electrical contacting of the electronic equipment arranged in the tiers.

The evaporators 15, which are the same in all tiers, are designed as substantially plate-shaped, rectangular hollow members in communication via respectively two connections 18, 19 with two vertical pipes 22 and 23 of the element 13.

The pipes 22, 23 are closed at the bottom and in communication with each other at the top by means of a condenser 28 arranged above the element 13; this condenser is mounted in the rack 14 at the very top. The evaporators 15, the pipes 22, 23, and the condenser 28 constitute a pressure-proof, sealed unit filled at least up to the top edge of the uppermost evaporator 15 and at most up to the lower portion of the condenser 28 with a boiling liquid. The boiling liquid is preferably a halogenated hydrocarbon, e.g. trichlorofluoromethane ($CCl_3F$) and is selected so that it has a boiling temperature of about 25–30° C. under the operating pressure prevailing in the unit. The heat loss of the electronic assemblies of one tier is conducted by the thermal conductors 12 to the evaporator 15 of this tier and transferred to the boiling liquid so that the latter begins to boil. The vapor bubbles remove the heat absorbed by the liquid in the upward direction.

In each evaporator 15, the thus-formed bubbles flow to the upper connection 18 thereof, through the latter into the pipe 22, and upwardly in the latter. The pipe 22 thus constitutes a riser for the vapor bubbles. The bubbles and, in case of vigorous boiling, the unvaporized liquid entrained by the bubbles, reach the condenser 28 by way of its upper connection 31. In the condenser, the bubble/liquid mixture is cooled to below the boiling temperature, and the bubbles are condensed. The thus-condensed, bubble-free liquid, on account of its relatively higher density, flows under the action of gravity from the top toward the bottom through the second vertical pipe 23 (downpipe) of the unit and enters the evaporators 15 through the lower connections 19 of the latter, where the liquid is again vaporized with formation of bubbles. The boiling liquid and the bubbles thus are subject to a vigorous natural circulation. There is no need for a recirculating pump.

The cavity of each evaporator 15 preferably comprises three horizontal tubular sections 35, 36, 38 and a plurality of vertical tubular sections 37, connected as follows: From the lower connection 19, the tubular section 35 extends horizontally in parallel to the perforation 17 over the entire length of the latter before making a turn by 180° in the upward direction and further extending, as a second horizontal tubular section 36, in parallel to the section 35 in the reverse direction. From section 36, the vertical tubular sections 37 are branched off, distributed over its entire length, in parallel and at approximately equal spacings in the upward direction. The sections 37 terminate at the top into the third horizontal tubular section 38. The latter ends in the upper connection 18 lying diagonally to the lower connection 19. This preferred arrangement of the evaporators 15 provides, independently of the positions of the evaporators in the element 13, i.e. independently of the fact whether the evaporator 15 is mounted in the rack 14 at the top or at the bottom, and independently of the amount of heat to be absorbed in each case, a type of valve action permitting practically only a flow of bubbles and liquid from he lower-disposed connection 19 in the direction to the higher-located connection 18 of the respective evaporator 15. This ensures that each tier of the electronic equipment rack 14 is capable at any time, independently of the other tiers, of absorbing the amount of heat respectively produced in the tier, and of removing this amount of heat in a directional manner to the riser 22.

In order to prevent heat flow from the evaporators 15 to the downpipe 23, it is advantageous to provide additional perforations 24, similar to perforations 17 and arranged between the evaporators 15 and the downpipe 23.

Due to the fact that the bubble/liquid mixture in the riser 22 has a lower density as compared with the pure liquid, and thus occupies an increased volume, this pipe is preferably made of a larger cross section than the downpipe 23 which contains solely liquid.

The mixture of bubbles and liquid arriving via the riser 22 is, as described above, condensed in condenser 28 while removing heat therefrom. The condenser 28 can be designed either as an air heat exchanger (as illustrated) or as a water heat exchanger, for example. In either case, the entire quantity of heat produced in the electronic equipment rack 14 is centrally conducted to this condenser via the riser 22, and is transferred in this condenser to the heat transfer medium, air, water, or the like.

The cooling medium, air, e.g. by means of one or several fans 40, or the cooling, medium, water, can be made available in dependence on the respective amount of heat produced and in dependence on the initial temperature of the cooling medium. For this purpose, for example, the fan motors 40, or a water reducing valve, are controlled so that there occurs between the connections 31 and 32 of condenser 28 an adequate, but not a maximally possible, temperature difference which, in case of the above-mentioned liquid and its boiling temperature, for example is 5–8° C.

When using air as the cooling medium, this air can be derived from the environment of the electronic equipment rack 14 and can be retransmitted into this environment. However, it is more advantageous to conduct the cooling air via ventilating ducts so that the environment of the electronic equipment rack 14 does not experience any temperature influence whatever by the heat loss produced in the electronic equipment rack 14.

To provide protection against overheating, for example upon failure of a fan motor 40, monitoring of the absolute temperature can be effected, which temperature must not exceed a certain maximum value. Furthermore, a safety fuse can be additionally provided for the pipe system of the unit 13, 28, especially a seal made of Wood's metal, which responds, for example, in a marginal case, at the relatively low temperature of about 90° C. and prevents explosion of the apparatus.

The unit of evaporators 15 and pipes 22, 23 is advantageously manufactured in a combined production process wherein conventionally two metal sheets are soldered or welded together in such a way that a (non-communicating) pipe structure is formed which is then inflated into pipes in a mol under a high pressure. This manufacturing procedure is economical and has the essential advantage that the entire pipe system of the unit 13 corresponding to FIG. 2 has only two connection points, namely at the connections 31, 32 of the condenser 28. The perforations 17 and 24, as well as possibly other holes provided, for example, for mounting purposes, can be readily provided by punching before or after inflation of tee pipes.

The pipe system of unit 13, 28 is filled via a charging nipple 42 with the aforedescribed boiling liquid 30 and adjusted with respect to its pressure. The charging nipple 42 is sealed after filling, for example by pinching. It is also possible to conveniently mount, at the charging nipple 42, the above-mentioned safety fuse, along with a storage and equalizing vessel for excess boiling liquid, if necessary.

During the manufacture of the unit 13 comprising the evaporators 15 and pipes 22, 23, in one piece according to the above-mentioned process, the evaporators 15 are formed in one plane and thus are directly suited for use as, for example, a planar rear wall of a relatively large electronic equipment rack 14. In order to enhance heat transfer between the thermally conductive plates 12, arranged at a right angle to the rear wall, and the evaporators 15, it is possible to arrange heat-equalizing plates in intimate contact with the latter and serving additionally for providing improved mechanical stability.

Figure 3A:
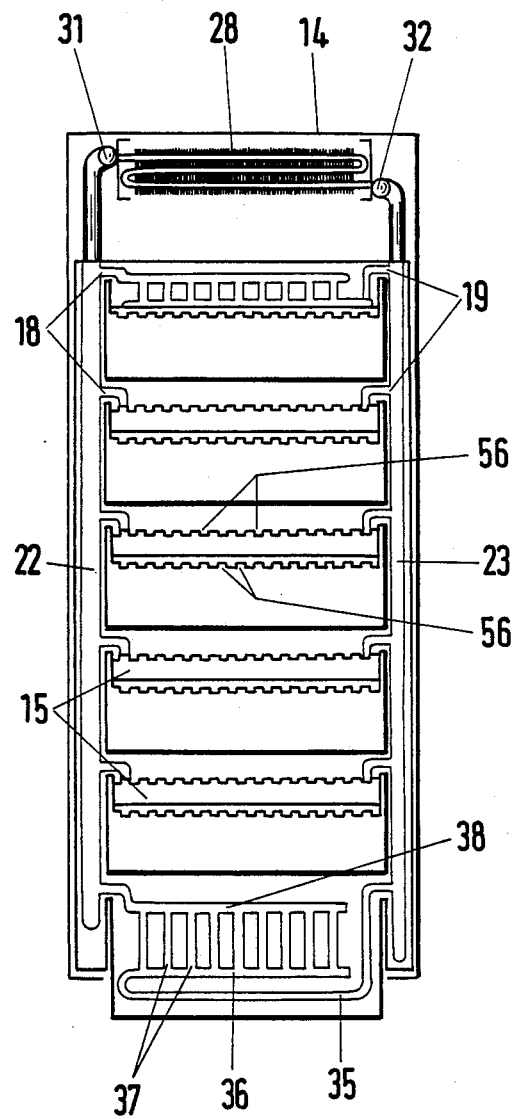
FIG. 3a is a front view corresponding to FIG. 2a of a modification of the device, likewise forming the rear wall of an electronic equipment rack.
Figure 3B:
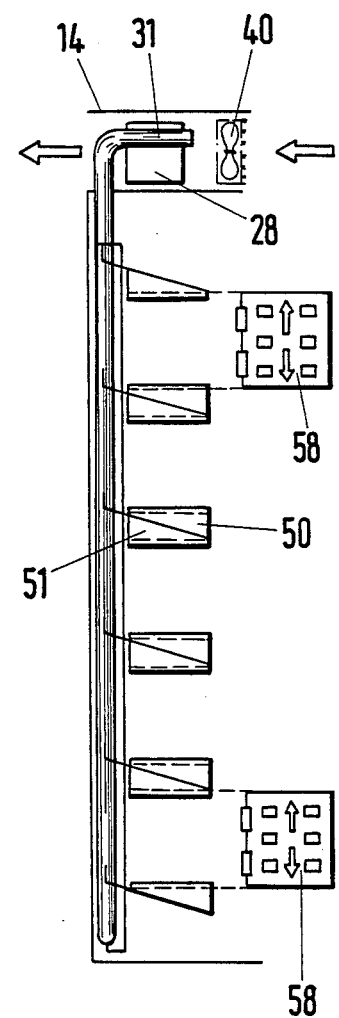
FIG. 3b is a lateral view corresponding to FIG. 2b of the modification with the electronic equipment rack.
Figure 4:
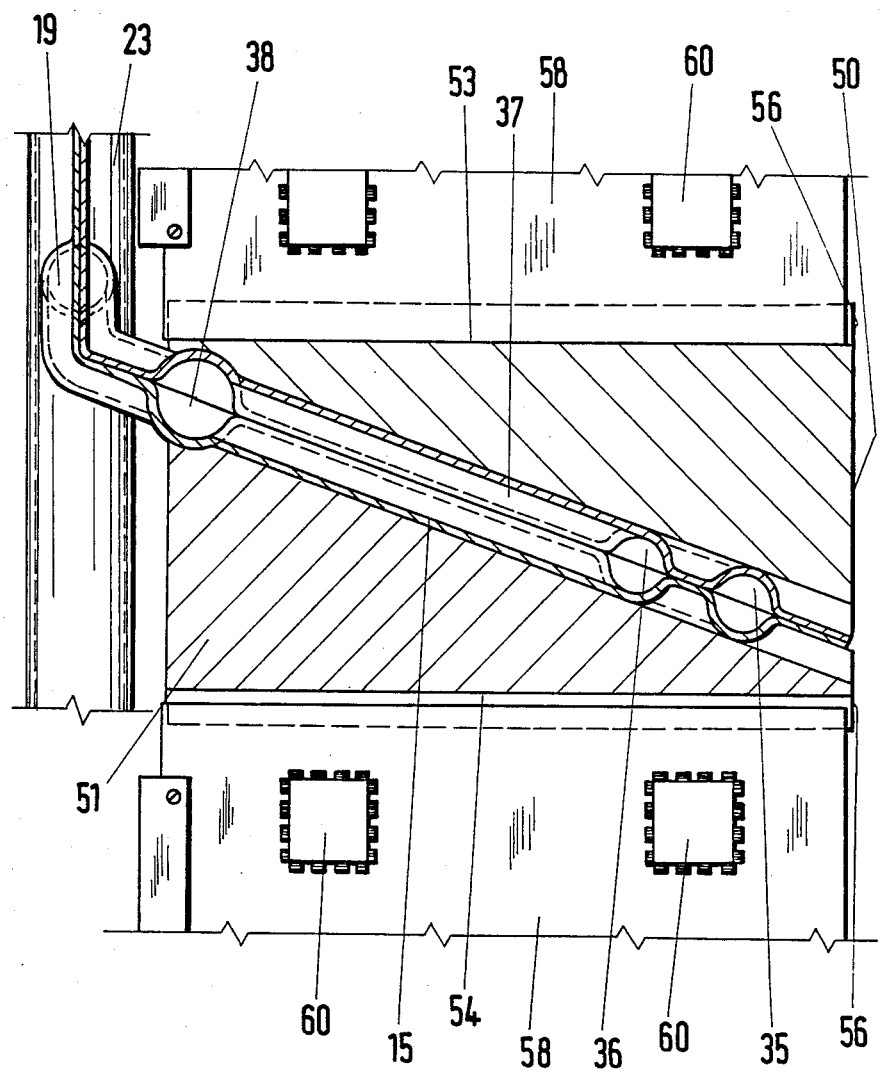
FIG. 4 is a sectional view of part of the modification, on an enlarged scale.

In a deviation from the above-described arrangement of the evaporators 15 in one plane, they can also be located in an inclined orientation by a suitable bending of the finished unit. FIGS. 3 and 4 show such a modification of the apparatus. The evaporators 15, except for the lowermost one, are bent, after having been suitably punched out of an arrangement according to FIG. 2, in the forward direction away from the unit 13 constituting the rear wall so that they exhibit an inclination to the horizontal of about 5–20°. The sectional view shown in FIG. 4 extends through an evaporator 15 along a tubular section 37 and transversely to the horizontal tubular sections 35, 36, and 38. (The tubular section 37 vertical in FIG. 2 is inclined in FIGS. 3 and 4.) In the background of FIG. 4, not in sectional view, the pipe 23 and a connection of evaporator 15 to this pipe 23 can be seen.

The evaporator 15 of the modification according to FIGS. 3 and 4, corresponding entirely to the evaporator 15 of FIG. 2 except for the position, carries on both sides a thermal conductor 50 and 51, respectively, for example of aluminum. These thermal conductors are connected to evaporator 15 with good thermal conductivity, for instance threaded together therewith, and are of a wedge shape. Their vacant surfaces 53 and 54, respectively, extend horizontally and carry a plurality of grooves 56 of which merely one is visible in the sectional view. Supporting plates 58 for electronic switching circuits, components, and/or structural elements 60 are inserted in these grooves 56.

The supporting plates 58 correspond to conventional, printed circuit boards, but are designed, for example by an inner thermally conductive layer of copper, so that they conduct the heat loss of components 10 along the plate 58 to the respective thermal conductor 50 or 51, which latter absorbs the heat and transfers it to the evaporator 15.

If a plurality of evaporators 15 and thermal conductors 50, 51 are provided in an electronic equipment rack 14, for example as shown in FIG. 3, then supporting plates 58 can be individually inserted, withdrawn, and exchanged analogously to the procedure with conventional racks.

The above-described apparatus has the essential advantage that the heat loss of the electronic equipment is efficiently passed on to a central condenser 28 capable of removing this heat loss, with a suitable design, for example by way of a hot-air shaft or a hot water conduit, without influence on the surroundings of the rack. The conductance of heat in the electronic equipment rack 14 takes place in such a way that hot spots cannot occur anywhere, and mutual influencing of heat generators is extensively precluded. Thus, in total, a stable and uniform temperature is ensured in the electronic equipment rack 14, extensively independent of the temperature of the environment of the rack. In case of semiconductor components, it is thus possible to ensure that the maximally permissible temperature of the depletion layers is not exceeded.

The apparatus can be manufactured in a simple way and is universally usable for large and small electronic equipment racks 14. The racks can be occupied with an extensive degree of freedom, as long as certain maximum heat outputs are not surpassed. Experiments revealed that it is readily possible to remove, per tier, up to about 700 W and, in case of a rack with 10 tiers, in total up to about 4 kW.

The structural design of the elements 13 permits numerous modifications. Thus, the number of evaporators 15 and, respectively, the number of tiers per electronic equipment rack, as well as their geometry with respect to width and height are freely selectable. It is also possible to provide merely a single evaporator 15 per electronic equipment rack. The hollow member of the evaporator 15 can also have a different configuration. For example, the tubular section 36 can be connected to the tubular section 35 approximately in the center instead of at the left-hand end, in which case tubular section 35 is correspondingly shorter. Furthermore, a common, for example rectangular cavity can be formed in place of the tubular sections 36, 37, 38. However, it should be kept in mind that the connection 19 be in communication with the lower portion, and the connection 18 with the upper portion, of the cavity in order to obtain the correct circulating direction of the bubbles and of the liquid in the cycle through the condenser 28.

Finally, the pipes 22, 23 can be bent out of the plane of the element 13, for example rearwardly by 90°, which may be of advantage for reasons of space, in that the element thereby becomes narrower.

Figure 5:
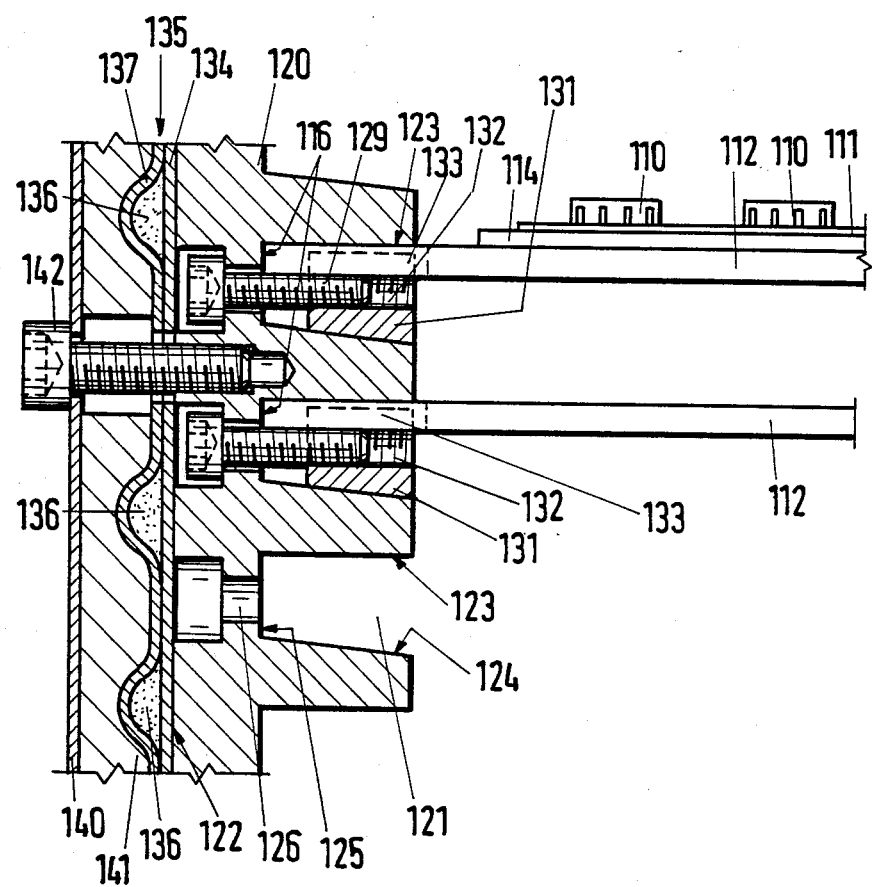
FIG. 5 is a vertical section through part of an evaporator and of the electrical elements connected therewith, pertaining to a further modification of the device according to this invention, on an enlarged scale.

In the embodiment illustrated in FIG. 5, electronic elements 110, preferably integrated semiconductor switching circuits, are arranged on substrate plates 111, for example of aluminum oxide. These plates are flatly connected with thermally conductive plates 112, either directly or by way of a thermally conductive supporting plate 114 increasing the stability of the substrate plate 111.

The thermally conductive plates 112 are planar, rectangular panels having a thickness of about 2–3 mm and a surface area of up to 15×30 cm, preferably made of aluminum and manufactured, for example, by punching from sheet material. The thermally conductive plates 112 can also be designed as panel-shaped, inherently sealed hollow members filled with a boiling liquid. In this case, heat transport take place, as in a heat tube (heat pipe) by vaporization and condensation of the liquid at various locations of the thermally conductive plates 112.

The heat-conductive plates 112 are in thermal contact, with their marginal faces 116 on the left in FIG. 5 and with their upper lateral faces 123, with a member 120 having a high heat capacity, serving as a heat buffer. This member is a cast or drawn part, preferably of aluminum, exhibiting on its one side (on the left in FIG. 5) a planar surface 122 and on its other side (on the right in FIG. 5) a plurality of parallel wedgeshaped grooves 121.

One wedge flank 123 of the wedge-shaped grooves 121 extends horizontally, the other flank 124 extends obliquely downwardly, and the planar groove bottom 125 is oriented at a right angle to the flank 123. The wedge angle is preferably 5°.

Each groove 121 is associated with a bore 126 connecting the planar face 122 with the groove bottom 125 and serving for insertion of a screw 129. The bore is flaring on the side of the planar surface 122 so that the screw head, for example the cylindrical head of a socket head cap screw, is countersunk.

For the establishment of good thermal contact between the heat-conducting plates 112 and the member 120, a wedge member 131 is pressed into each of the grooves 121, which wedge member is adapted to the shape of the grooves. Each wedge member 131 is tightened and held in place by one of the screws 129; on account of the wedge configuration, a considerable lateral contact pressure exists between the respective heat-conducting plate 112 and the associated first wedge flank 123.

The wedge member 131 exhibits on its face in heat contact with the respective heat-conductive plate 112 small-area raised portions (not illustrated) by means of which the wedge member penetrates, with plastic deformation, into the heat-conductive plate 112. Thereby, upon tightening of the screw 129, a force component in the direction toward the groove bottom 125 becomes effective, placing the heat-conducting plate 112 with its lateral face 116 in abutting position with the groove bottom 125. The wedge member 131 furthermore exhibits a raised portion 133 at the location of the threaded bore 132, this portion entering, for centering purposes, an associated slot of the heat-conductive plate 112. In this way, without special expenditure, a very accurate alignment of the thermally conductive plates 112 perpendicularly to the member 120 is ensured.

The member 120 contacts with its planar face 122 one side 134 of an evaporator 135. The evaporator 135 is one of several evaporators of an element manufactured from two metal sheets 134, 137 in pressure-tight connection with each other; this element corresponds to element 13. The portion of the sheet 134 contacted by the member 120 is planar or almost planar; the sheet 137 has curved and planar areas. The curved areas of the sheet 137 form cavities 136 together with the sheet 134 (corresponding to the tubular sections 35–38 of element 13) for the liquid; the planar regions of the sheet 137 are connected in a pressure-proof fashion with the sheet 134 (for example by welding or soldering). The sheet 137 can exhibit, instead of curved zones, also, for example, rectangularly bulging zones so that the cavities 136 exhibit a cross section that is quadrangular, for example.

The member 120 is joined to a planar mounting plate 140 in a force-derived and pressure connection. The pressure is transmitted from this plate 140 to the member 120 by an elastic intermediate layer 141 and by way of the evaporator 135, whereas a few, for example two, screws 142 provide the tensile forces between the mounting plate 140 and the member 120. The pressure is dimensioned so that the planar surface 122 of the member 120 and the planar or almost planar surface 134 of the evaporator 135 are urge against each other over a maximally large area and without interspaces.

The mounting plate 140 can be fashioned as a relatively thick metal sheet of a thickness of, for example, 10 mm, or as a thin, laterally beveled metal sheet provided with reinforcing strips in the center.

The intermediate layer 141 is preferably of foam rubber, effecting in addition to the elastic connection a thermal insulation between the evaporator 135 and the mounting plate 140 favorable for the evaporation of the liquid in evaporator 135. The intermediate layer 141 can be a planar sheet material forced with greater strength against the bulging regions of the metal sheet 137, or it can exhibit indentations corresponding to the bulges so that an extensively uniform surface contact under pressure is produced. In order to ensure that conditions will remain the same over a long period of time, the intermediate layer 141 must be age-resistant and permanently elastic.

The apparatus can be manufactured in a simple and inexpensive way: The thermally conductive plates 112 are cut out or, respectively, punched out in rectangular form from plate material. The wedge members 131 are simple milled parts of aluminum with a screw thread. The member 120 is either cut from plate material by milling or, more advantageously, is cast o drawn. Assembly is effected by plugging the aforementioned parts together and tightening the screws 129.

The preassembled heat-conducting elements 112, 120 are then combined in the manner of a sandwich construction by threaded connection with the evaporator 135, the intermediate layer 141, and the mounting plate 140.

The parts thus joined together for heat conductance exhibit on all contact surfaces a considerable amount of contact pressure, by means of which, on the one hand, the parts are connected in a dimensionally stable way and, on the other hand, unevennesses of the surface are at least in part compensated for. For this reason, the parts do not need a very precise machining. The tolerances to be maintained are low. A possible introduction of materials enhancing heat conductance for filling out the remaining cavities, for example a highly viscous thermally conductive paste, can reduce the tolerances even further.

The apparatus is flexible, can be readily adapted to the respective conditions of the electronic equipment to be cooled, for example to the number of respective substrate plates 111, to a horizontally disposed or vertically standing arrangement of the substrate plates 111, the size of the latter, etc., and can be disassembled at any time.

We claim:

1. Apparatus for dissipating the heat loss of a plurality of assemblies of electrical elements (10) arranged in tiers in superimposed relationship, comprising a plate-like element (13) consisting of two sheets (134, 137), said two sheets (134, 137) joined together in superimposed pressure-sealed relationship forming therebetween a plurality of mutually spaced evaporator cavity means (15; 135) arranged one above the other substantially along the length of said plate-like element, and forming therebetween a first conduit (22) and a second conduit (23) extending substantially along the length of said plate-like element, all of said evaporator cavity means (15; 135) being connected in parallel communication to one another between said first and said second conduits (22, 23), thermally conductive means (12, 50, 51, 112), each of said evaporator cavity means (15; 135) being respectively connected by said thermally conductive means with the assembly or assemblies of electrical elements arranged in a tier, a condenser (28) arranged at a higher level than the topmost evaporator cavity means (15; 135) of said plurality of evaporator cavity means, said condenser (28) having an inlet (31) connected to said first conduit (22) and an outlet (32) connected to said second conduit (23), said condenser (28), said evaporator cavity means (15; 135) and said first and second conduits (22, 23) constituting a unit sealed in a pressure-proof fashion, an evaporable liquid filling said unit to such an extent that the topmost evaporator cavity means (15; 135) of said plurality of evaporator cavity means is filled entirely or at least partially with said evaporable liquid, and the condenser (28) is filled not at all or at most partially with said evaporable liquid.

2. Apparatus according to claim 1, in which the inlet (31) is arranged at the top and the outlet (32) is arranged at the bottom of the condenser (28).

3. Apparatus according to claim 1, in which each evaporator (15; 135) having a branched conduit network (18, 19, 35, 36, 37, 38), comprising plural branch conduits (37) which terminate at the top (18) into a conduit network section (38) connected to the first conduit (22) and at the bottom (19) into a conduit network section (35, 36) connected to the second conduit (23).

4. Apparatus according to claim 3, in which the conduit network (18, 19, 35, 36, 37, 38) of each evaporator cavity means (15; 135) comprises three conduit network sections (35, 36, 38) positioned one above the other and extending essentially over the entire length of the evaporator (15; 135) and a plurality of at least approximately vertical branch conduits (37), wherein the second conduit (23) is connected by a lower conduit network section (35) with a central conduit network section (36), the latter is connected over approximately its entire length by said branch conduits (37) with an upper conduit network section (38), and said upper conduit network section is connected with the first conduit (22).

5. Apparatus according to claim 1, in which said two sheets (134, 137) are two metal sheets (134, 137) having perforations (17, 24) therethrough, to avoid heat conductance, between the evaporator cavity means (15; 135) and/or between the evaporator cavity means (15; 135) and the second conduit (23).

6. Apparatus according to claim 1, including a rack (14) accommodating the assemblies of electrical elements, in which said evaporator cavity means (15; 135) and the first and second conduits (22, 23) constitute the rear wall of a rack (14) accommodating the assemblies of electrical elements.

7. Apparatus according to claim 1, in which said evaporator cavity means (15; 135) are formed approximately the shape of plate-like, rectangular hollow members (15; 135) arranged in parallel superposition between the substantially vertically extending first and second conduits (22, 23).

8. Apparatus according to claim 7, in which said plate-like rectangular hollow members (15; 135) are inclined with respect to the horizontal, the angle of inclination being between 5° and 20°, and all of said evaporator cavity means exhibiting at least approximately the same angle of inclination.

9. Apparatus according to claim 8, including at least one heat conductor (50, 51) attached, in a heat-conductive way, to each evaporator cavity means (15; 135), said heat conductor including a substantially horizontally extending, surface (53, 54) which has several parallel grooves (56), and heat-conductive plates (58) carrying the assembly or assemblies of electrical elements (60) of one tier, insertable in said parallel grooves (56) for establishment of thermal contact with said evaporator cavity means.

10. Apparatus according to claim 1 or 9, in which said first conduit (22) has a larger cross section than the second conduit (23).

11. Apparatus according to claim 1 or 9, in which said liquid is a halogenated hydrocarbon, especially trichlorofluoromethane, the boiling temperature of which, under the operating pressure, is about 25-30° C.

12. Apparatus according to claim 1, in which said evaporator cavity means (15; 135) and the first and second conduits (22, 23) lie in a vertical plane common to all of them.

13. Apparatus according to claim 1, including a fan (40) connected for cooling said condenser so that the temperature of said evaporable liquid at said inlet (31) of said condenser (28) is approximately 5-8° above the temperature of said evaporable liquid at said outlet (32) of said condenser (28).

14. Apparatus according to claim 1, wherein said first conduit (22) is connected in communication with the upper portion of each evaporator cavity means (15; 135) and said second conduit (23) is connected in communication with the lower portion of each evaporator cavity means (15; 135).

15. Apparatus according to claim 1, including a heat-conducting member (120) having a large connecting area (122), each of said evaporator cavity means (15; 135) connected with a respective heat-conducting member (120) through the large connecting area (122) whereby the heat-conducting members act as a heat buffer, said thermally conductive means (12, 112) carrying an assembly of electrical elements (110), and means (121, 131, 132) connecting each heat-conducting member (120) in heat-conducting connection with a respective thermally conductive means (12, 112).

16. Apparatus according to claim 15, in which said two sheets (134, 137) are metal sheets, one of said metal sheets (134) forming one side of the evaporator cavity means (15; 135) is at least approximately planar, and the other of said metal sheets (137) forming the other side of the evaporator cavity means (15; 135) has regions that are bulging for forming the cavities (35, 36, 37, 38, 136) of the evaporator cavity means and therebetween planar regions closely joined to the said one of said metal sheets (134); and that said heat-conducting member (120) is connected at least approximately with the entire area of said one metal sheet (134) forming the one side of the evaporator cavity means (15; 135).

17. Apparatus according to claim 16, in which said other metal sheet (137) forming the other side of the evaporator cavity means (15; 135) is covered by a thermally insulating layer (141).

18. Apparatus according to claim 15, in which said means (121, 131, 132) adapted to connect each heat-conducting member (120) includes at least one mounting means (121) and one fastening means (131) for a respective thermally conductive means (12, 112) to be connected with the assembly or assemblies of electrical elements (110) or carrying such assembly or assemblies.

19. Apparatus according to claim 15, in which each heat-conducting member (120) includes, on the side facing away from the evaporator cavity means (15; 135), one or more horizontal wedge-shaped grooves (121) disposed one above the other at mutual spacings, and a wedge member (131) for each wedge-shaped groove, said thermally conductive means comprising a plate-shaped heat conductor means (112), which is connected to the assembly or assemblies of electrical elements (110) or which carries the latter, and said plate-shaped heat conductor means (112) is adapted to be clamped in place in the wedge-shaped groove (121) by said wedge member (131).

20. Apparatus according to claim 19, in which said wedge member (131) includes along one wedge flank small-area raised portions fashioned in such a way that they are capable of penetrating into the heat conductor means (112) when clamping the latter in the wedge-shaped groove (121).

21. Apparatus according to claim 19 or 20, a respective screw (129) in the heat-conducting member (120) engaging each wedge member (131) operative to tighten said wedge member in the wedge direction.

22. Apparatus according to claim 15, in which said heat-conducting member (120) is releasably connected (142) to the evaporator cavity means (15; 135).

23. Apparatus according to claim 15, in which said thermally conductive means (12, 112) comprises an inherently sealed hollow heat transfer device (112) comprises an inherently liquid capable of boiling.

* * * * *